(12) United States Patent
Park et al.

(10) Patent No.: US 10,847,362 B2
(45) Date of Patent: Nov. 24, 2020

(54) METHOD OF FABRICATING SEMICONDUCTOR DEVICE

(71) Applicant: SAMSUNG ELECTRONICS CO., LTD., Suwon-si (KR)

(72) Inventors: Gyu-Hee Park, Hwaseong-si (KR); Yangsun Park, Hwaseong-si (KR); Jaesoon Lim, Seoul (KR); Younjoung Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 16/155,976

(22) Filed: Oct. 10, 2018

(65) Prior Publication Data
US 2019/0304770 A1 Oct. 3, 2019

(30) Foreign Application Priority Data

Apr. 2, 2018 (KR) ........................ 10-2018-0037939

(51) Int. Cl.
| C23C 16/20 | (2006.01) |
| C23C 16/455 | (2006.01) |
| C23C 16/08 | (2006.01) |
| H01L 29/78 | (2006.01) |
| H01L 21/02 | (2006.01) |
| H01L 29/66 | (2006.01) |
| H01L 21/3213 | (2006.01) |
| H01L 21/762 | (2006.01) |

(52) U.S. Cl.
CPC .......... *H01L 21/0228* (2013.01); *C23C 16/08* (2013.01); *C23C 16/20* (2013.01); *C23C 16/45534* (2013.01); *H01L 21/32133* (2013.01); *H01L 21/76224* (2013.01); *H01L 29/66545* (2013.01)

(58) Field of Classification Search
CPC ... C23C 16/08; C23C 16/20; C23C 16/45527; C23C 16/45553; H01L 29/0673; H01L 29/42392
See application file for complete search history.

(56) References Cited

U.S. PATENT DOCUMENTS

| 7,611,751 B2 | 11/2009 | Elers |
| 8,178,401 B2 | 5/2012 | Gilmer et al. |

(Continued)

FOREIGN PATENT DOCUMENTS

| JP | 2017-020056 A | 1/2017 |
| KR | 10-2016-0093375 A | 8/2016 |

(Continued)

Primary Examiner — Zandra V Smith
Assistant Examiner — Molly K Reida
(74) Attorney, Agent, or Firm — Lee IP Law, P.C.

(57) ABSTRACT

A method of fabricating a semiconductor device, the method including forming semiconductor patterns on a substrate such that the semiconductor patterns are vertically spaced apart from each other; and forming a metal work function pattern to fill a space between the semiconductor patterns, wherein forming the metal work function pattern includes performing an atomic layer deposition (ALD) process to form an alloy layer, and the ALD process includes providing a first precursor containing an organoaluminum compound on the substrate, and providing a second precursor containing a vanadium-halogen compound on the substrate.

19 Claims, 18 Drawing Sheets

(56) References Cited

U.S. PATENT DOCUMENTS

| | | |
|---|---|---|
| 8,404,530 B2 | 3/2013 | Ando et al. |
| 8,679,587 B2 | 3/2014 | Chang et al. |
| 9,187,511 B2 | 11/2015 | Gatineau et al. |
| 9,368,590 B2 | 6/2016 | Fan et al. |
| 9,627,214 B2 | 4/2017 | Jagannathan et al. |
| 9,646,890 B2 | 5/2017 | Bohr |
| 2004/0121195 A1* | 6/2004 | Ghantous ............ H01M 4/0471 429/3 |
| 2004/0234704 A1 | 11/2004 | Garg et al. |
| 2008/0102204 A1* | 5/2008 | Elers ....................... C23C 16/32 427/249.1 |
| 2013/0277748 A1* | 10/2013 | Lee ..................... H01L 27/0886 257/368 |
| 2015/0159025 A1 | 6/2015 | Takagi et al. |
| 2015/0362374 A1 | 12/2015 | Wheeler et al. |
| 2016/0118165 A1 | 4/2016 | Fujita et al. |
| 2017/0133278 A1 | 5/2017 | Bao et al. |
| 2017/0213826 A1 | 7/2017 | Kim et al. |
| 2017/0236821 A1 | 8/2017 | Kim et al. |
| 2017/0288171 A1 | 10/2017 | Ito |
| 2019/0140066 A1* | 5/2019 | Lee ....................... H01L 29/775 |

FOREIGN PATENT DOCUMENTS

| | | |
|---|---|---|
| KR | 10-1742616 B1 | 5/2017 |
| KR | 10-2017-0105767 A | 9/2017 |

* cited by examiner

METHOD OF FABRICATING SEMICONDUCTOR DEVICE

CROSS-REFERENCE TO RELATED APPLICATION

Korean Patent Application No. 10-2018-0037939, filed on Apr. 2, 2018, in the Korean Intellectual Property Office, and entitled: "Method of Fabricating Semiconductor Device," is incorporated by reference herein in its entirety.

BACKGROUND

1. Field

Embodiments relate to a method of fabricating a semiconductor device.

2. Description of the Related Art

Due to their small-size, multifunctionality, and/or low-cost characteristics, semiconductor devices are important elements in the electronic industry. Generally, semiconductor devices are classified into a memory device for storing data, a logic device for processing data, and a hybrid device for performing various functions.

SUMMARY

The embodiments may be realized by providing a method of fabricating a semiconductor device, the method including forming semiconductor patterns on a substrate such that the semiconductor patterns are vertically spaced apart from each other; and forming a metal work function pattern to fill a space between the semiconductor patterns, wherein forming the metal work function pattern includes performing an atomic layer deposition (ALD) process to form an alloy layer, and the ALD process includes providing a first precursor containing an organoaluminum compound on the substrate, and providing a second precursor containing a vanadium-halogen compound on the substrate.

The embodiments may be realized by providing a method of fabricating a semiconductor device, the method including forming a gate electrode on a substrate such that the gate electrode includes an alloy layer including vanadium and aluminum, wherein forming the gate electrode including the alloy layer includes providing a first precursor on the substrate; and providing a second precursor containing a vanadium-halogen compound on the substrate, wherein the first precursor includes a compound represented by the following Chemical Formula 1:

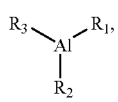
(1)

and wherein, in Chemical Formula 1, $R_1$ to $R_3$ are each independently a hydrogen atom, a $C_1$-$C_{10}$ alkyl group, a $C_3$-$C_{10}$ alkenyl group, or a $C_3$-$C_{10}$ alkynyl group, provided that at least one of $R_1$ to $R_3$ is a $C_1$-$C_{10}$ alkyl group, a $C_3$-$C_{10}$ alkenyl group, or a $C_3$-$C_{10}$ alkynyl group.

The embodiments may be realized by providing a method of fabricating a semiconductor device, the method including performing an atomic layer deposition (ALD) process to form a VAlC layer on a substrate, wherein the ALD process includes a plurality of process cycles, each process cycle including providing a first precursor on the substrate, and providing a second precursor containing $VCl_4$ on the substrate, wherein the first precursor includes a compound represented by the following Chemical Formula 1:

(1)

and wherein, in Chemical Formula 1, $R_1$ to $R_3$ are each independently a hydrogen atom, a $C_1$-$C_{10}$ alkyl group, a $C_3$-$C_{10}$ alkenyl group, or a $C_3$-$C_{10}$ alkynyl group, provided that at least one of $R_1$ to $R_3$ is a $C_1$-$C_{10}$ alkyl group, a $C_3$-$C_{10}$ alkenyl group, or a $C_3$-$C_{10}$ alkynyl group.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
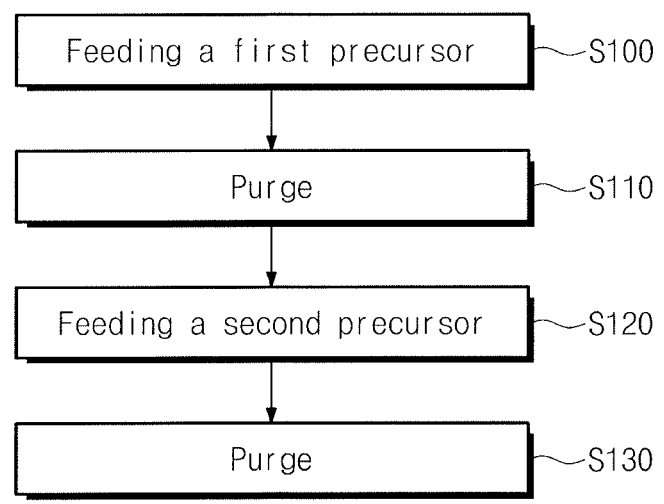
FIG. 1 illustrates a flow chart of a cycle of an atomic layer deposition (ALD) process for forming an alloy layer, according to some embodiments.
Figure 2:
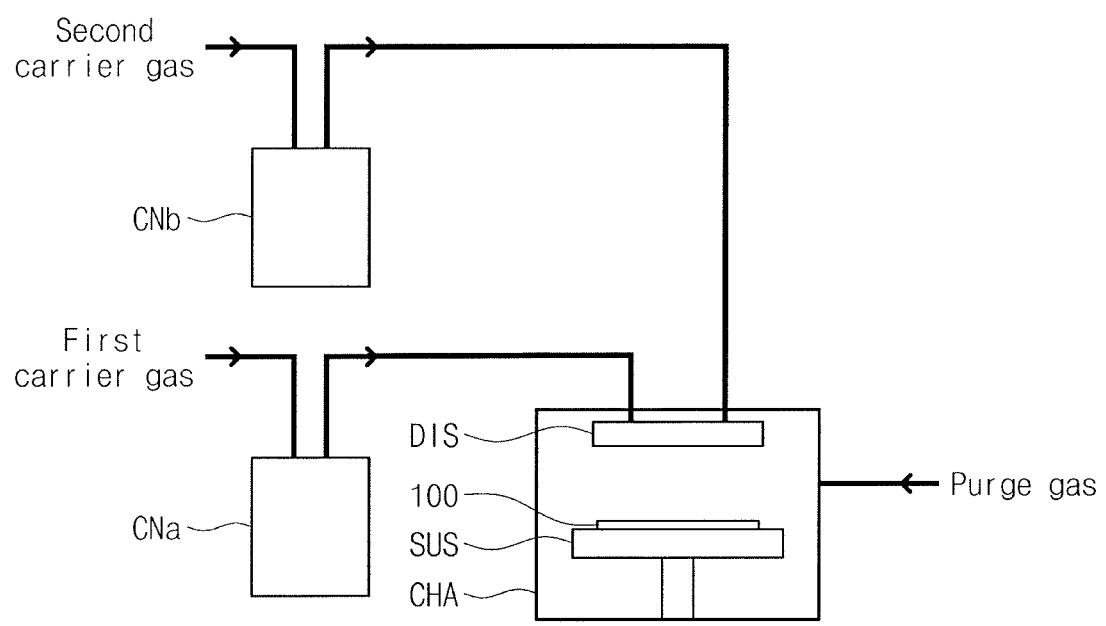
FIG. 2 illustrates a conceptual diagram schematically showing a deposition system, which is used to deposit an alloy layer, according to some embodiments.
Figure 3:
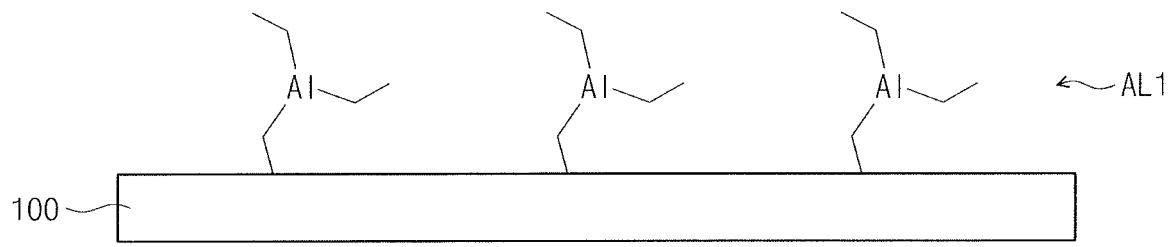
FIGS. 3 and 4 illustrate sectional views of the cycle of the ALD process shown in FIG. 1.
Figure 4:
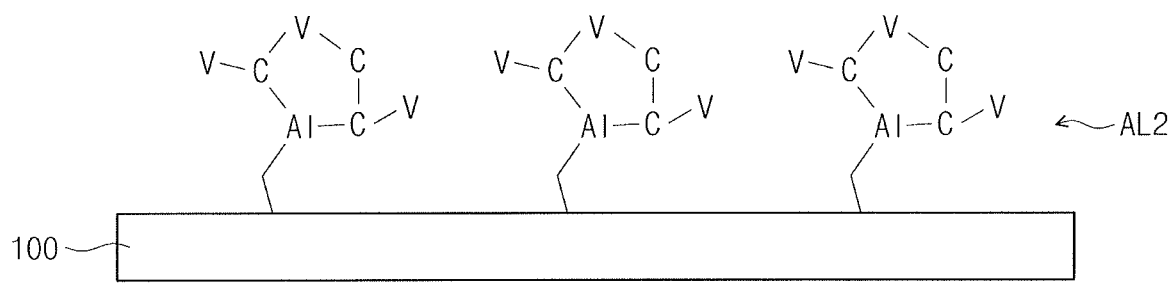
Figure 5:
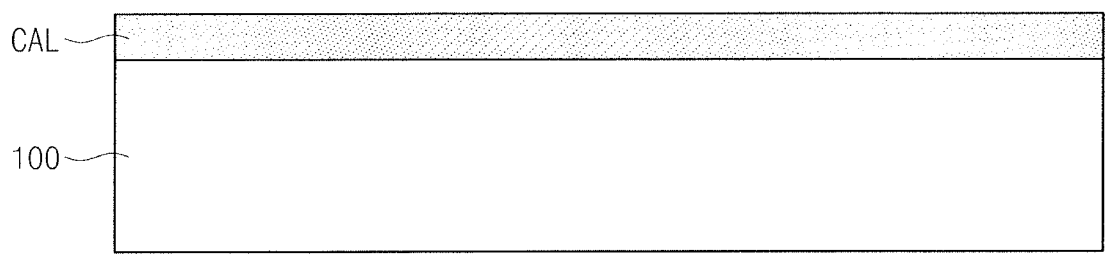
FIG. 5 illustrates a sectional view of an alloy layer, which is fabricated by the method according to some embodiments.

FIG. 1 is a flow chart illustrating a cycle of an atomic layer deposition (ALD) process for forming an alloy layer, according to some embodiments. FIG. 2 is a conceptual diagram schematically illustrating a deposition system, which is used to deposit an alloy layer, according to some embodiments. FIGS. 3 and 4 are sectional views illustrating the cycle of the ALD process shown in FIG. 1. FIG. 5 is a sectional view illustrating an alloy layer, which is fabricated by the method according to some embodiments.

Referring to FIGS. 1 to 5, an alloy layer CAL may be formed on a substrate 100. The formation of the alloy layer CAL may include performing an atomic layer deposition (ALD) process on the substrate 100.

The ALD process may include a plurality of process cycles A, which are sequentially performed, and each of which includes feeding a first precursor into a chamber (in S100), purging the chamber (in S110), feeding a second precursor into the chamber (in S120), and purging the chamber (in S130).

For example, as shown in FIG. 2, the substrate 100 may be provided in a process chamber CHA. The substrate 100 may be loaded on a susceptor SUS, which may be placed in the process chamber CHA. The susceptor SUS may support the substrate 100. In addition, the susceptor SUS may rotate the substrate 100.

The first precursor may be fed into the process chamber CHA provided with the substrate 100 (in S100). The first precursor may be stored in a first container CNa that is connected to the process chamber CHA. The first precursor in the first container CNa may be heated and evaporated. The evaporated first precursor may be fed into the process chamber CHA along with a first carrier gas that is supplied into the first container CNa. The first carrier gas may be an inert gas, e.g., argon, helium, or neon.

The first precursor may contain an organoaluminum compound with the following Chemical Formula 1.

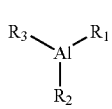

[Chemical Formula 1]

In Chemical Formula 1, $R_1$ to $R_3$ may each independently be, e.g., a hydrogen atom, a $(C_1\text{-}C_{10})$ alkyl group, a $(C_3\text{-}C_{10})$ alkenyl group, or a $(C_3\text{-}C_{10})$ alkynyl group. In an implementation, at least one of $R_1$ to $R_3$ may be a $(C_1\text{-}C_{10})$ alkyl group, a $(C_3\text{-}C_{10})$ alkenyl group, or a $(C_3\text{-}C_{10})$ alkynyl group. In an implementation, the first precursor may be a compound of the following Chemical Formula 2, i.e., triethylaluminum.

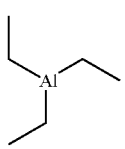

[Chemical Formula 2]

The first precursor fed into the process chamber CHA may be uniformly sprayed onto the substrate 100 through a distribution plate DIS. The first precursor may be fed into the process chamber CHA during a first feeding time. The first feeding time may range from 0.1 seconds to 100 seconds. The first precursor sprayed onto the substrate 100 may be used to form a first atomic layer AL1 on the substrate 100.

After the feeding of the first precursor into the process chamber CHA, an internal space of the process chamber CHA may be purged using a purge gas (in S110). The purge gas may be an inert gas.

Referring back to FIGS. 1, 2, and 4, the second precursor may be fed into the process chamber CHA provided with the substrate 100 (in S120). The second precursor may be stored in a second container CNb that is connected to the process chamber CHA. The second precursor in the second container CNb may be heated and evaporated. The evaporated second precursor may be fed into the process chamber CHA along with a second carrier gas that is supplied into the second container CNb.

The second precursor may contain a vanadium-halogen compound. In an implementation, the second precursor may include, e.g., vanadium chloride, vanadium fluoride, or vanadium bromide. In an implementation, the second precursor may include, e.g., $VCl_4$, $VCl_5$, $VF_4$, $VF_5$, $VBr_4$, or $VBr_5$. The second precursor may remain liquid or solid at atmospheric pressure (e.g., 1 atm) and room temperature (e.g., 25° C.).

For example, $VCl_4$ may remain liquid at atmospheric pressure and room temperature, and the $VCl_4$ in a liquid state may be stored in the second container CNb. The liquid $VCl_4$ may be easy to handle. The $VCl_4$ may be easily evaporated by various evaporation methods including a thermal heating. Furthermore, the $VCl_4$ may have a relatively high vapor pressure at a process temperature for an ALD process, and a process time may be greatly reduced.

The second precursor fed into the process chamber CHA may be uniformly sprayed onto the substrate 100 through the distribution plate DIS. The second precursor may be fed into the process chamber CHA during a second feeding time. The second feeding time may range from 0.1 seconds to 100 seconds.

The second precursor sprayed onto the substrate 100 may be react with the first atomic layer AL1, thereby forming a second atomic layer AL2. For example, the second precursor may react with a hydrocarbon of the first atomic layer AL1, and in this case, a carbon atom of the first atomic layer AL1 and a vanadium atom of the second precursor may react with each other to form a C—V bond. During the formation of the C—V bond, a volatile gas of a hydrogen-halogen compound (e.g., HCl), may be produced.

After the feeding of the second precursor into the process chamber CHA, the internal space of the process chamber CHA may be purged using a purge gas (in S130). The purge gas may be an inert gas.

During the ALD process, an internal pressure of the process chamber CHA may be maintained within a range from 0.01 kPa to 150 kPa. An internal temperature of the process chamber CHA may be maintained within a range from 200° C. to 500° C.

Referring back to FIGS. 1, 2, and 5, the cycle A may be repeatedly performed to form a plurality of second atomic layers AL2 constituting the alloy layer CAL. The alloy layer CAL may include, e.g., $V_xAl_yC_z$, where x ranges from 20 to 40, y ranges from 5 to 30, and z ranges from 30 to 55. The work function and resistivity of the alloy layer CAL may be adjusted to desired levels by controlling an aluminum content (i.e., y value) of the alloy layer CAL. The higher the aluminum content of the alloy layer CAL, the higher the resistivity of the alloy layer CAL and the lower the work function of the alloy layer CAL. Maintaining y at 5 or greater may help ensure that the alloy layer CA has a sufficiently high resistivity and a sufficiently low work function. Maintaining y at 30 or less may help ensure that the alloy layer CAL has a sufficiently high low work function and a sufficiently low resistivity. For example, in the case where the value y is within a range from 5 to 30, the alloy layer CAL may be formed to have a relatively low resistivity and a relatively low work function.

In an implementation, the alloy layer CAL may include vanadium aluminum carbide. The alloy layer CAL may include C—V bonds and C—Al bonds. In an implementation, the alloy layer CAL may further include oxygen and/or hydrogen.

The following Examples are provided in order to highlight characteristics of one or more embodiments, but it will be understood that the Examples are not to be construed as limiting the scope of the embodiments. Further, it will be understood that the embodiments are not limited to the particular details described in the Examples.

Experimental Example

The deposition system of FIG. 2 was used to form a VAlC layer on a silicon oxide layer, which was formed on a substrate. Triethylaluminum ($Et_3Al$) was used as the first precursor, and vanadium tetrachloride ($VCl_4$) was used as the second precursor.

The first container CNa containing the first precursor was maintained at 60° C. The first precursor was heated and evaporated using a bubbler. The second container CNb containing the second precursor was maintained at 25° C. The first precursor and the second precursor were heated and evaporated using the bubbler. During a deposition process, a temperature of the substrate was maintained at 400° C. An internal pressure of the process chamber CHA was adjusted to 100 Pa.

In Experimental Embodiment 1, the first precursor was fed into the process chamber CHA for 5 seconds (i.e., the feeding time of the first precursor was 5 seconds). After the feeding of the first precursor, the process chamber CHA was purged using an argon gas for 30 seconds. The second precursor was fed into the process chamber CHA for 0.1 seconds. After the feeding of the second precursor, the process chamber CHA was purged using an argon gas for 30 seconds. The cycle including the afore-described steps was repeated thirty times to form a VAlC layer (in Experimental Embodiment 1).

In Experimental Embodiment 2, the feeding time of the first precursor was 6 seconds, and except for this difference in the feeding time of the first precursor, the VAlC layer in Experimental Embodiment 2 was formed by the same method as that in Experimental Embodiment 1. In Experimental Embodiment 3, the feeding time of the first precursor was 7 seconds, and except for this difference in the feeding time of the first precursor, the VAlC layer in Experimental Embodiment 3 was formed by the same method as that in Experimental Embodiment 1.

Figure 17:
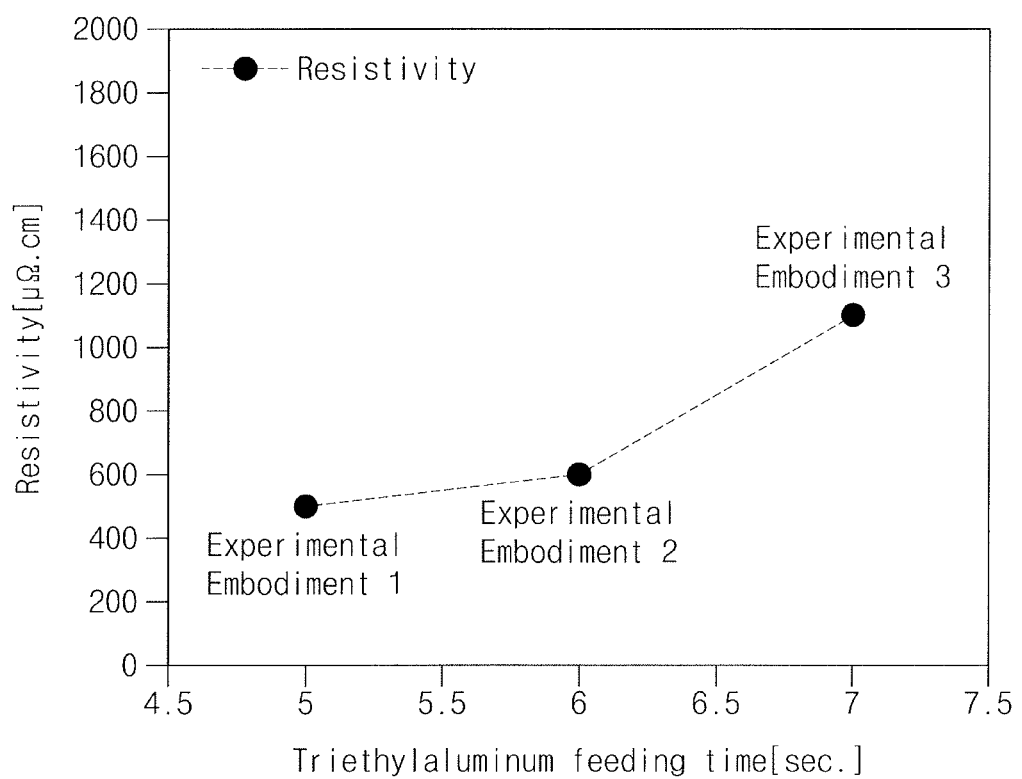
FIG. 17 illustrates a graph showing resistivity values of VAlC layers, according to experimental embodiments 1 to 3.

FIG. 17 illustrates a graph showing resistivity values measured from the VAlC layers of Experimental Embodiments 1 to 3, respectively. As shown in FIG. 17, the longer the feeding time of the first precursor, the higher the resistivity of the VAlC layer. For example, the higher the aluminum content of the VAlC layer, the higher the resistivity of the VAlC layer.

Figure 18A:
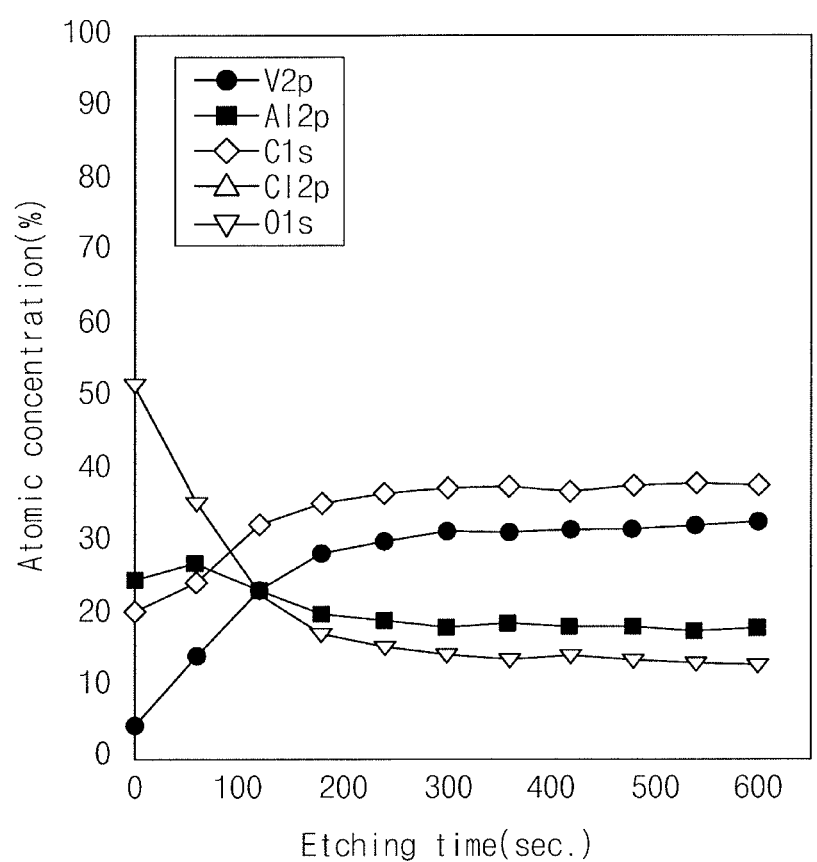
FIGS. 18A to 18C illustrate X-ray photoelectron spectroscopy graphs, which were obtained from VAlC layers according to the experimental embodiments 1 to 3.
Figure 18B:
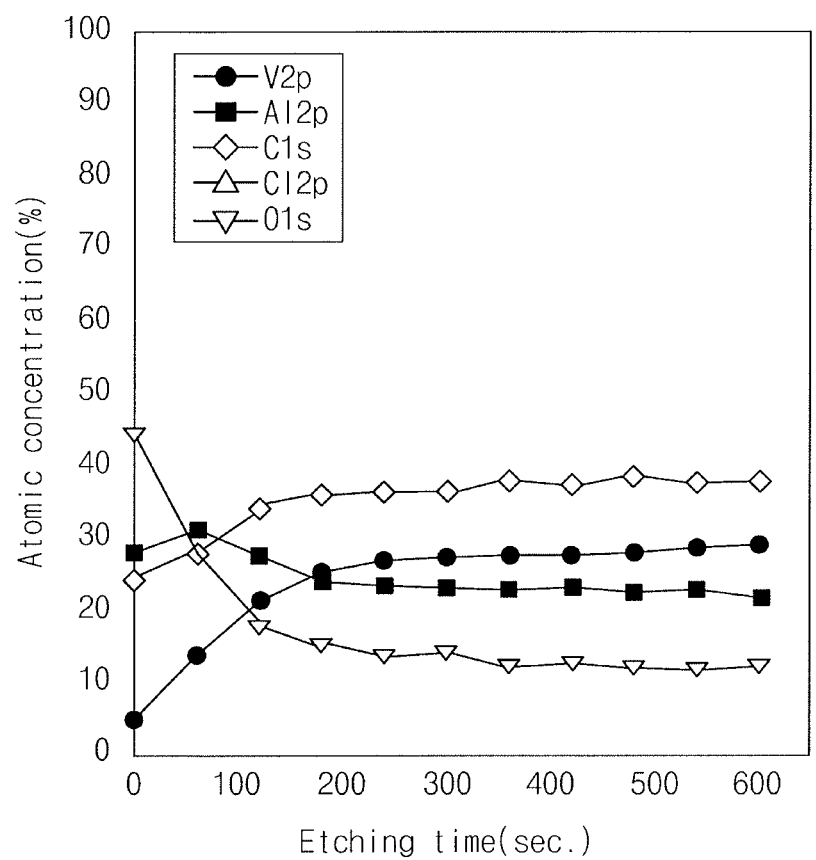
Figure 18C:
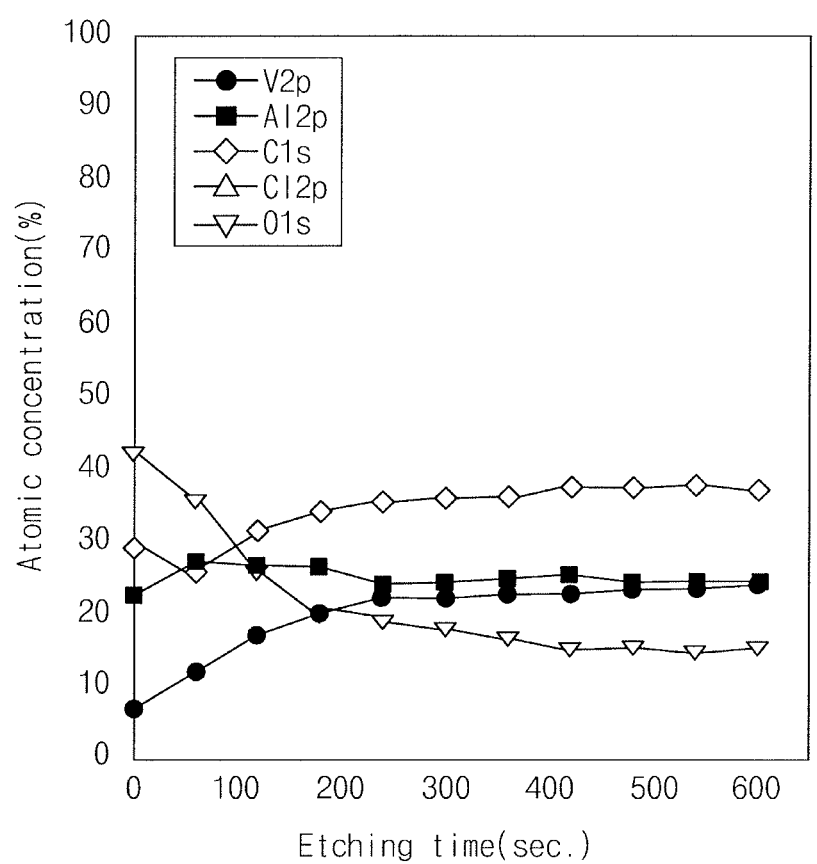

FIGS. 18A, 18B, and 18C illustrate graphs showing results that were obtained from an X-ray photoelectron spectroscopy on the VAlC layers of Experimental Embodiments 1 to 3. Each of the VAlC layers of Experimental Embodiments 1 to 3 was a vanadium- and aluminum-containing carbide layer, as shown in FIGS. 18A, 18B, and 18C. Furthermore, FIGS. 18A, 18B, and 18C show that the longer the feeding time of the first precursor, the larger the aluminum content of the VAlC layer.

Figure 6:
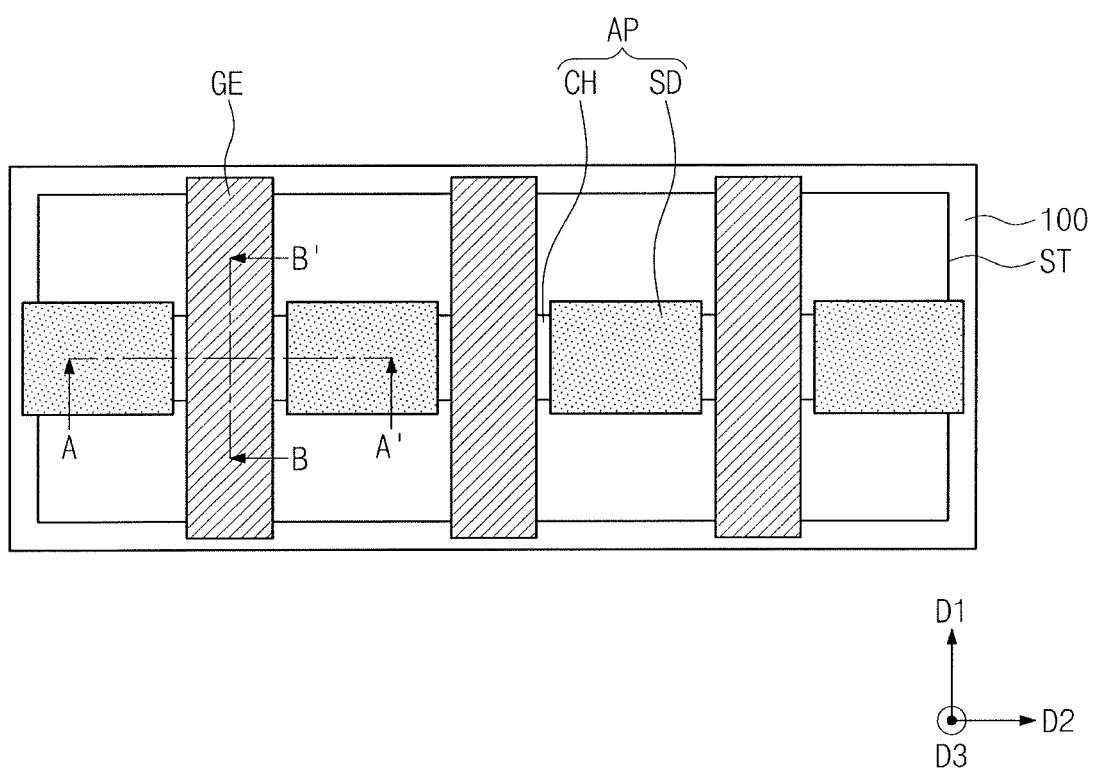
FIG. 6 illustrates a plan view of a semiconductor device according to some embodiments.
Figure 7:
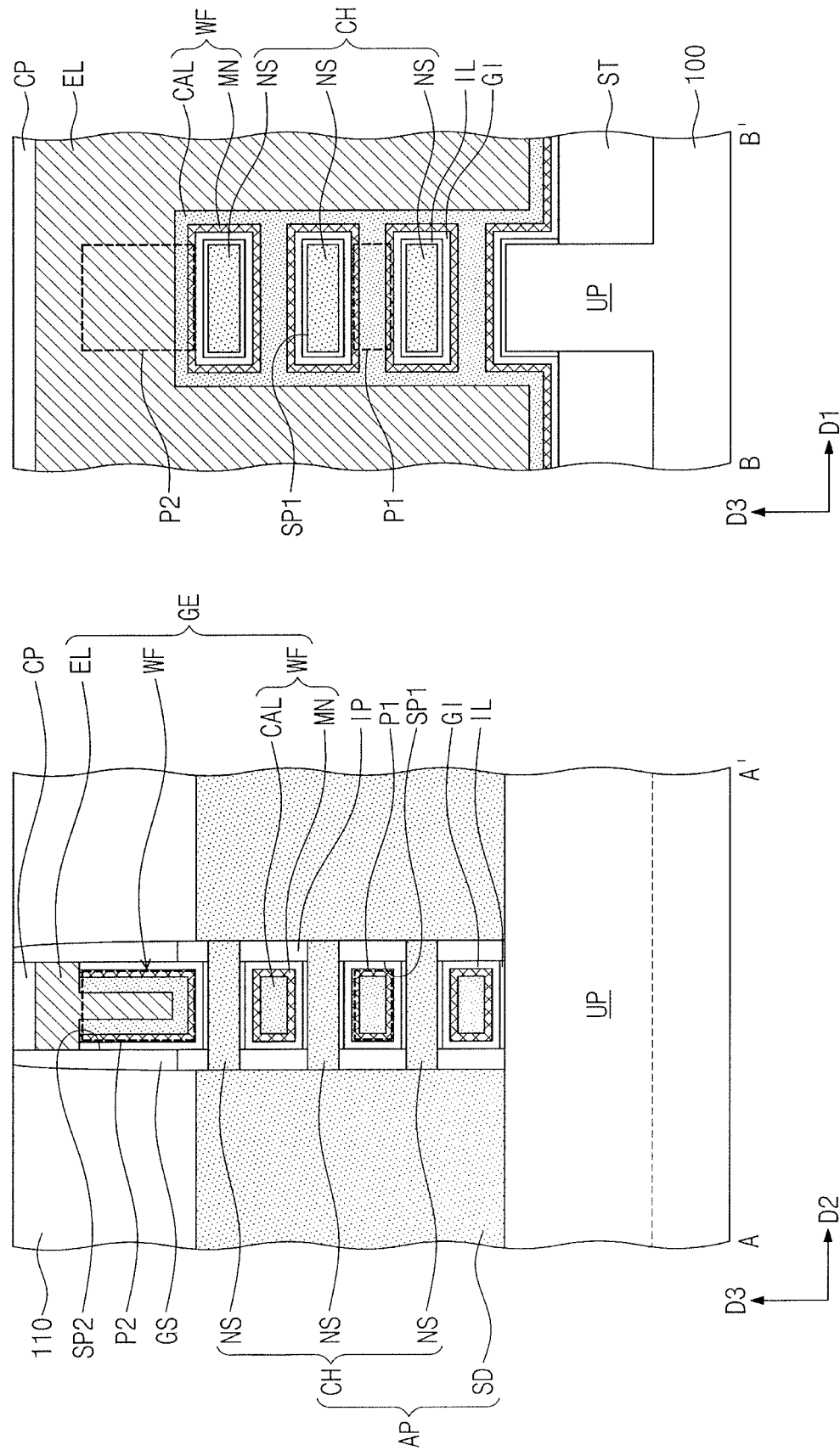
FIG. 7 illustrates a view of vertical sections that are taken along lines A-A' and B-B' of FIG. 1.

FIG. 6 is a plan view illustrating a semiconductor device according to some embodiments. FIG. 7 is a view illustrating vertical sections that are taken along lines A-A' and B-B' of FIG. 1.

Referring to FIGS. 6 and 7, the substrate 100 may be provided. The substrate 100 may be a semiconductor substrate. In an implementation, the substrate 100 may be a silicon substrate or a germanium substrate. In an implementation, the substrate 100 may be a silicon-on-insulator (SOI) wafer. Transistors may be provided on a region of the substrate 100.

In an implementation, a plurality of memory cells for storing data may be formed on a memory cell region, which is a region of the substrate 100. For example, a plurality of memory cell transistors constituting a plurality of SRAM cells may be provided on the memory cell region of the substrate 100. The transistors of FIGS. 6 and 7 may be some of the memory cell transistors.

In an implementation, a plurality of logic transistors constituting a logic circuit of a semiconductor device may be formed on a logic cell region, which is a region of the substrate 100. For example, the logic transistors may be provided on the logic cell region of the substrate 100. The transistors of FIGS. 6 and 7 may be some of the logic transistors.

For example, the transistors of FIGS. 6 and 7 may be PMOSFETs. For example, the transistors of FIGS. 6 and 7 may be NMOSFETs.

A device isolation layer ST may be provided on the substrate 100. The device isolation layer ST may define an upper pattern UP, which is an upper portion of the substrate 100. The upper patterns UP may extend in a second direction D2. The device isolation layer ST may be formed to fill trenches formed at both sides of the upper pattern UP. A top surface of the device isolation layer ST may be lower than that of the upper pattern UP.

An active pattern AP may be provided on the upper pattern UP. For example, the active pattern AP may be vertically overlapped with the upper pattern UP. The active pattern AP may be a line-shaped pattern extending in the second direction D2.

The active pattern AP may include channel patterns CH and source/drain patterns SD. The channel pattern CH may be interposed between a pair of source/drain patterns SD. The channel pattern CH may include a plurality of vertically-stacked semiconductor patterns NS.

The semiconductor patterns NS may be spaced apart from each other in a third direction D3 perpendicular to a top surface of the substrate 100. The semiconductor patterns NS may be vertically overlapped with each other. Each of the source/drain patterns SD may be in direct contact with side surfaces of the semiconductor patterns NS. In other words, the semiconductor pattern NS may be provided to connect an adjacent pair of the source/drain patterns SD to each other. In an implementation, the channel pattern CH is may have three semiconductor patterns NS. In an implementation, all of the semiconductor patterns NS may have substantially the same thickness, or at least two of the semiconductor patterns NS may have thickness different from each other. The semiconductor patterns NS may be formed of or include, for example, at least one of Si, SiGe, or Ge.

The source/drain patterns SD may be epitaxial patterns, which are formed by an epitaxial growth process using the semiconductor patterns NS and the upper pattern UP as a seed layer. In the case where the transistors of FIGS. 6 and 7 are PMOSFETs, the source/drain patterns SD may be formed of or include a material capable of exerting a compressive stress on the channel pattern CH. For example, the source/drain patterns SD may be formed of or include a semiconductor material (e.g., SiGe) whose lattice constant is greater than that of the channel pattern CH. The source/drain patterns SD may be doped with impurities to have a p-type conductivity.

In the case where the transistors of FIGS. 6 and 7 are NMOSFETs, the source/drain patterns SD may be formed of or include the same semiconductor material (e.g., Si) as that of the channel pattern CH. The source/drain patterns SD may be doped with impurities to have an n-type conductivity.

Gate electrodes GE may be provided to cross the channel patterns CH and to extend in a first direction D1. Each of the gate electrodes GE may include a metal work function pattern WF and an electrode pattern EL. The electrode pattern EL may be provided on the metal work function pattern WF. The electrode pattern EL may have resistance lower than that of the metal work function pattern WF. The electrode pattern EL may have resistance lower than that of the alloy layer CAL. For example, the electrode pattern EL may be formed of or include at least one of low resistance metallic materials (e.g., including aluminum (Al), tungsten (W), titanium (Ti), and tantalum (Ta)).

The metal work function pattern WF may include a metal nitride layer MN and an alloy layer CAL on the metal nitride layer MN. The alloy layer CAL may have substantially the same features as those of the alloy layer CAL previously described with reference to FIGS. 1 to 5. For example, the alloy layer CAL may include a material with a chemical structure of or represented by $V_xAl_yC_z$. The alloy layer CAL may have a relatively low work function. An aluminum content (i.e., the y value) of the alloy layer CAL may be adjusted to control the work function and resistivity of the alloy layer CAL. The metal nitride layer MN may have a work function that is greater than that of the alloy layer CAL. For example, the metal nitride layer MN may be a titanium nitride (TiN) layer or a titanium oxynitride (TiON) layer.

The metal work function pattern WF may be provided to fill a first space SP1 between the semiconductor patterns NS. The metal work function pattern WF may surround each of the semiconductor patterns NS. For example, the metal work function pattern WF may be provided to face top, bottom, and side surfaces of each of the semiconductor patterns NS. Each of the transistors of FIGS. 6 and 7 may be provided in the form of a gate-all-around type field effect transistor.

Each of the gate electrodes GE may have a first portion P1 and a second portion P2. The first portion P1 may be located in the first space SP1 which is formed between vertically adjacent ones of the semiconductor patterns NS. For example, the first portion P1 may be interposed between the vertically adjacent ones of the semiconductor patterns NS.

The second portion P2 may be located in a second space SP2, which is formed on the topmost one of the semiconductor pattern NS. The second space SP2 may be a space that is defined by a pair of the gate spacers GS, which will be described below, and the topmost one of the semiconductor pattern NS. For example, the second portion P2 may be located on the topmost one of the semiconductor pattern NS and may be interposed between the pair of the gate spacers GS.

The first portion P1 of the gate electrode GE may be composed of the metal work function pattern WF, and the second portion P2 of the gate electrode GE may be composed of the metal work function pattern WF and the electrode pattern EL which are sequentially stacked. The electrode pattern EL may be spaced apart from the first portion P1 of the gate electrode GE. For example, the electrode pattern EL may not fill the first space SP1. The electrode pattern EL may be absent in the first space SP1.

A pair of the gate spacers GS may be provided on two opposite side surfaces of each of the gate electrodes GE. The gate spacers GS may extend along the gate electrodes GE or in the first direction D1. The gate spacers GS may have top surfaces that are higher than those of the gate electrodes GE. The metal work function pattern WF on the channel pattern CH may extend along inner side surfaces of the gate spacers GS or in the third direction D3. The gate spacers GS may be formed of or include, e.g., at least one of SiCN, SiCON, or SiN. In an implementation, the gate spacers GS may include a multi-layer that is made of at least two of SiCN, SiCON, or SiN.

A gate capping layer CP may be provided on each of the gate electrodes GE. The gate capping layer CP may extend along the gate electrode GE or in the first direction D1. A top surface of the gate capping layer CP may be substantially coplanar with those of the gate spacers GS. The gate capping layer CP may be formed of or include a material having an etch selectivity with respect to a first interlayered insulating layer 110, which will be described below. In an implementation, the gate capping layer CP may be formed of or include at least one of SiON, SiCN, SiCON, or SiN.

Insulating patterns IP may be interposed between the source/drain patterns SD and the gate electrodes GE. The insulating patterns IP may be interposed between the semiconductor patterns NS that are vertically separated from each other. The insulating patterns IP may electrically disconnect the gate electrodes GE from the source/drain patterns SD. The first space SP1 may be defined by a pair of the insulating patterns IP, which are horizontally adjacent to each other, and a pair of the semiconductor patterns NS, which are vertically adjacent to each other. The insulating patterns IP may be formed of or include, for example, silicon nitride.

An interface layer IL may be provided to surround each of the semiconductor patterns NS. The interface layers IL may be provided to directly cover the semiconductor patterns NS. The interface layers IL may be formed of or include, for example, silicon oxide.

A gate dielectric layer GI may be interposed between the semiconductor patterns NS and the gate electrode GE. The gate dielectric layer GI may be provided to conformally cover the first space SP1 and to partially fill the first space SP1. The gate dielectric layer GI may be formed of or include at least one of high-k dielectric materials whose dielectric constants are higher than that of silicon oxide. For example, the high-k dielectric materials may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The first interlayered insulating layer 110 may be provided on the top surface of the substrate 100. The first interlayered insulating layer 110 may be provided to cover the device isolation layer ST and the source/drain patterns SD. A top surface of the first interlayered insulating layer 110 may be substantially coplanar with those of the gate capping layers CP. In an implementation, the first interlayered insulating layer 110 may include a silicon oxide layer or a silicon oxynitride layer.

In an implementation, contacts may be provided to penetrate the first interlayered insulating layer 110 and may be connected to the source/drain patterns SD. The contacts may be formed of or include at least one of metallic materials (e.g., tungsten (W), titanium (Ti), and tantalum (Ta)).

Figure 9:
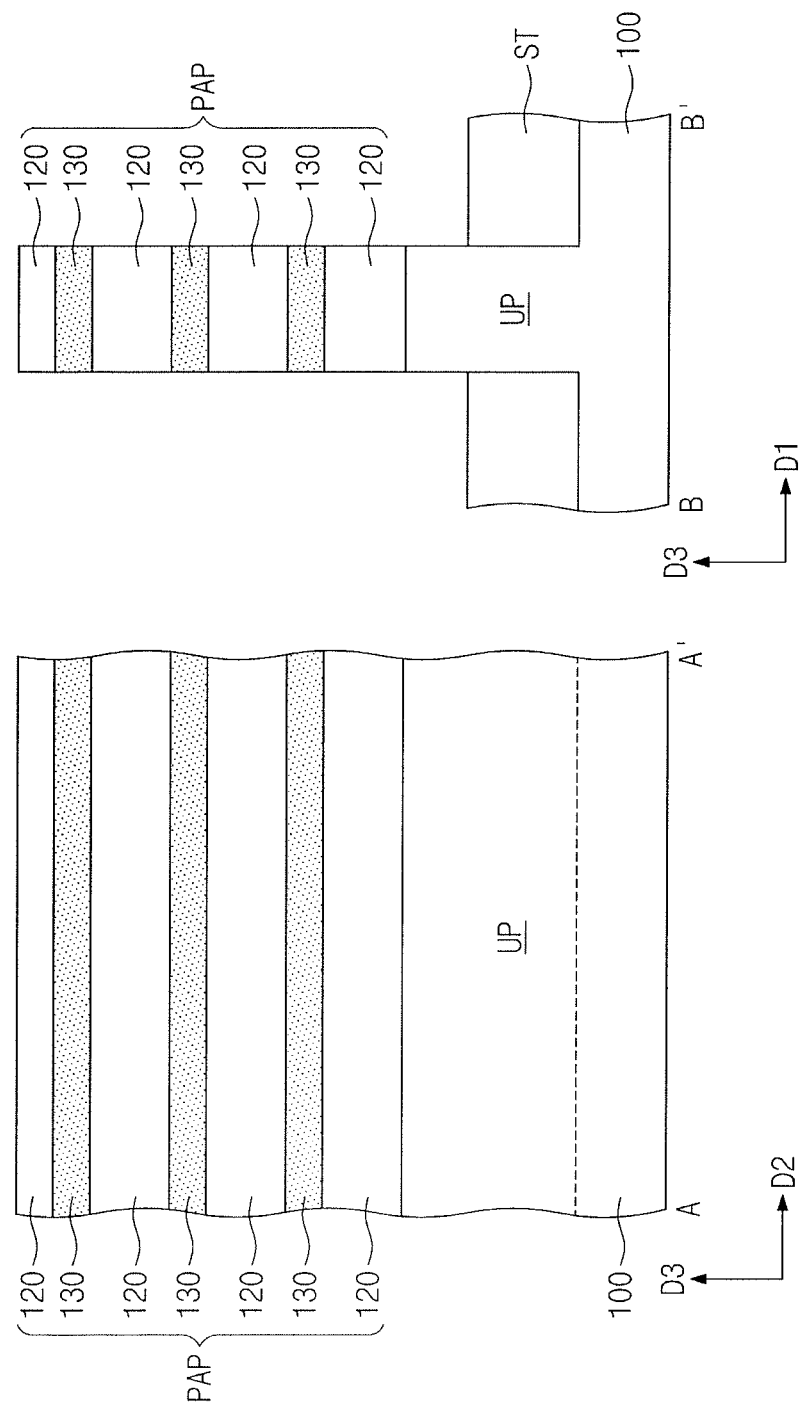
FIG. 9 illustrates a view of vertical sections taken along lines A-A' and B-B' of FIG. 8.
Figure 10:
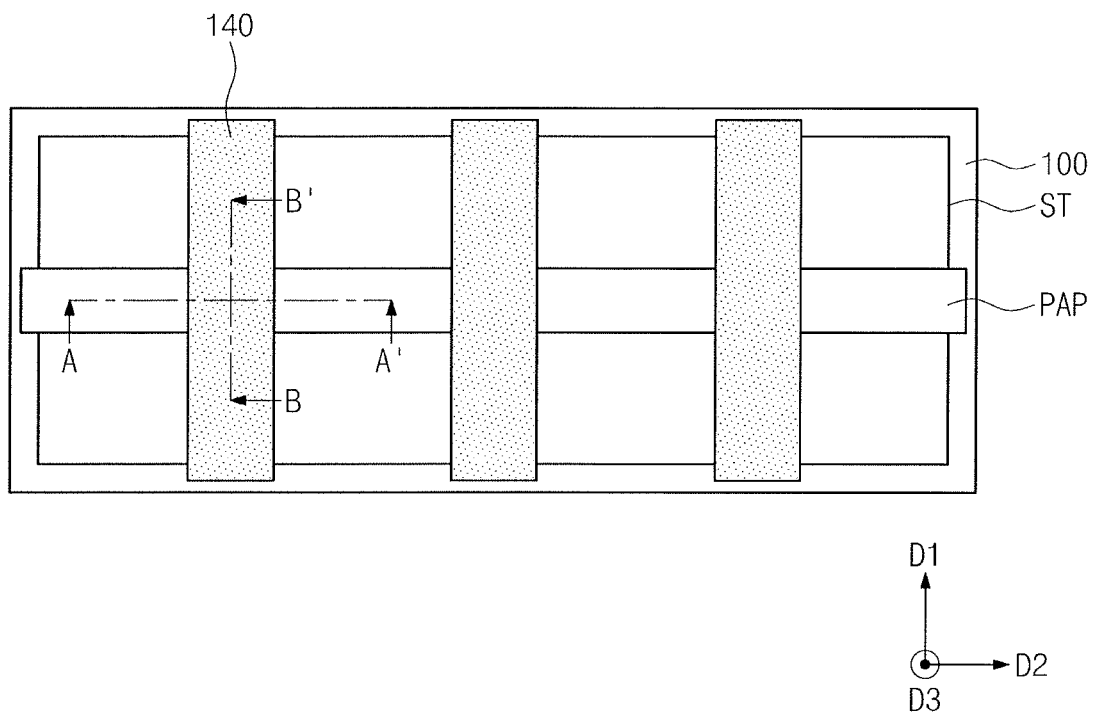
Figure 11:
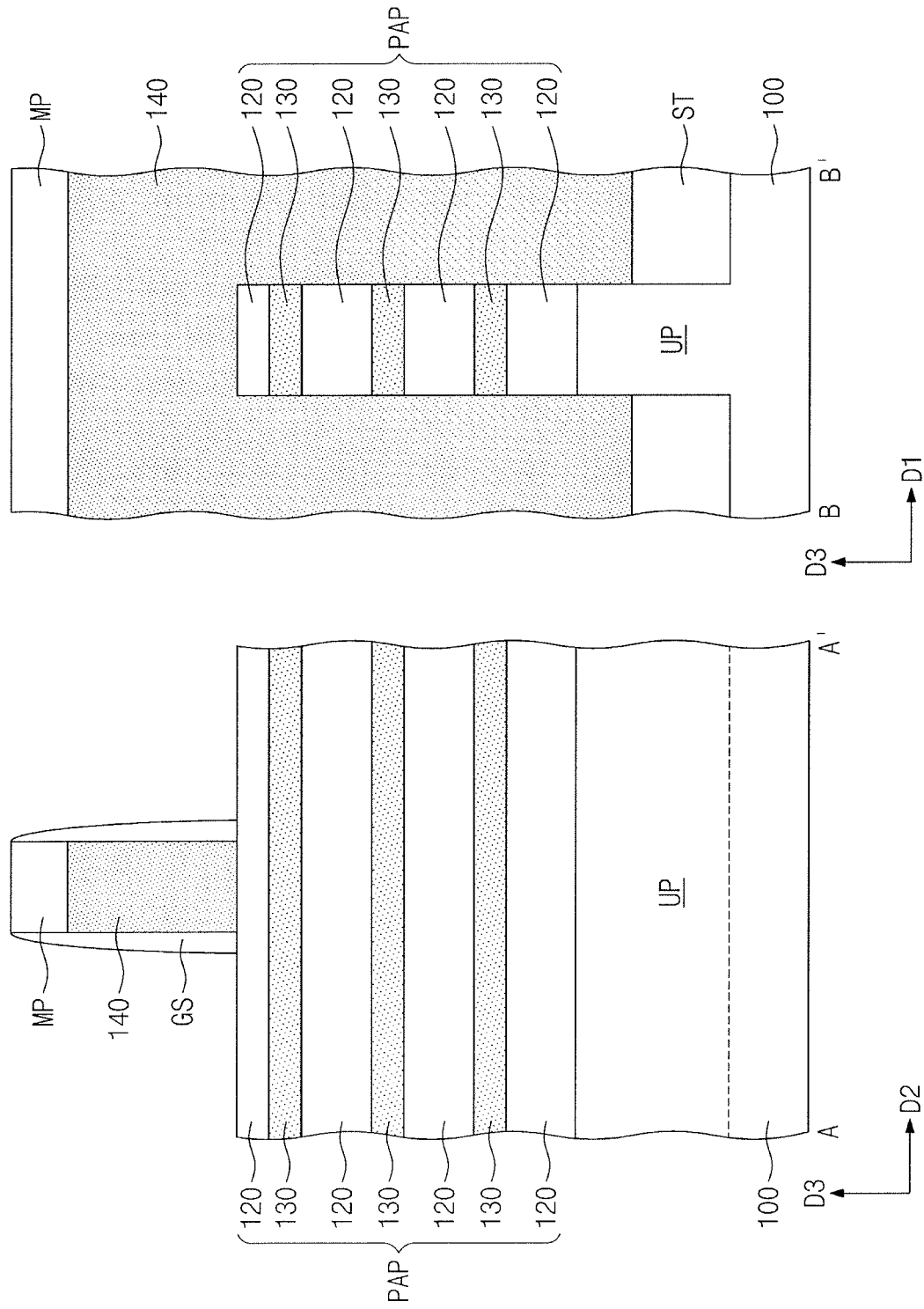
FIG. 11 illustrates a view of vertical sections taken along lines A-A' and B-B' of FIG. 10.
Figure 12:
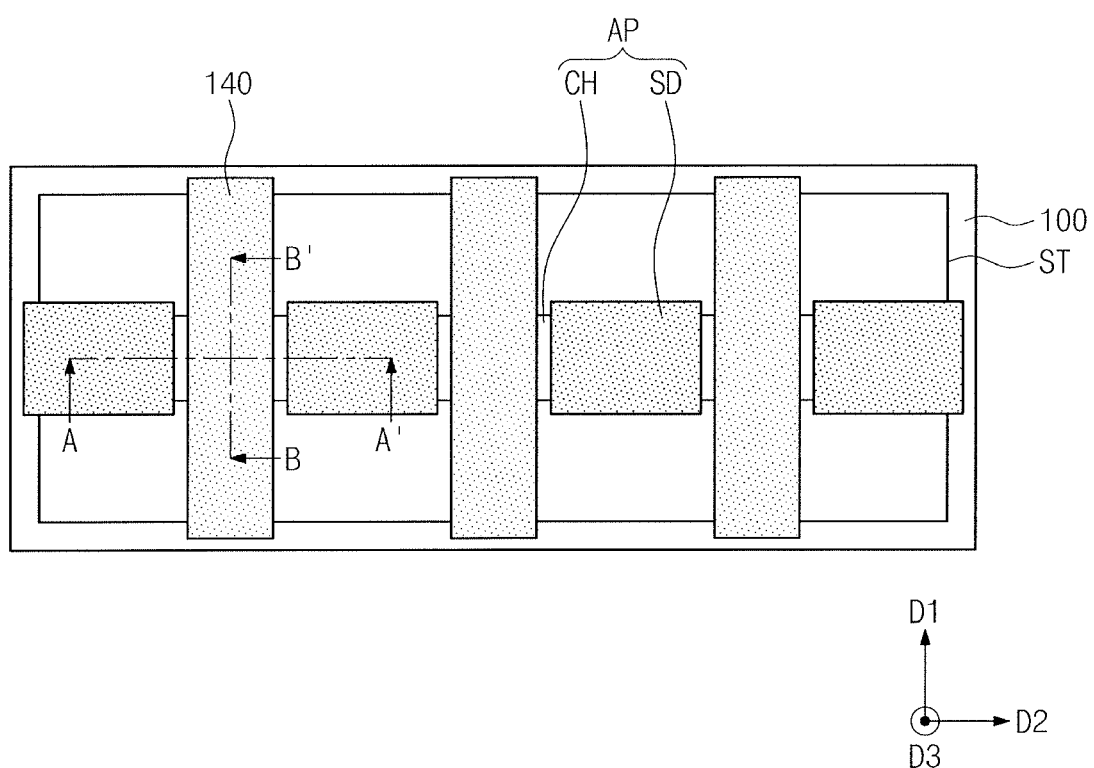
Figure 13:
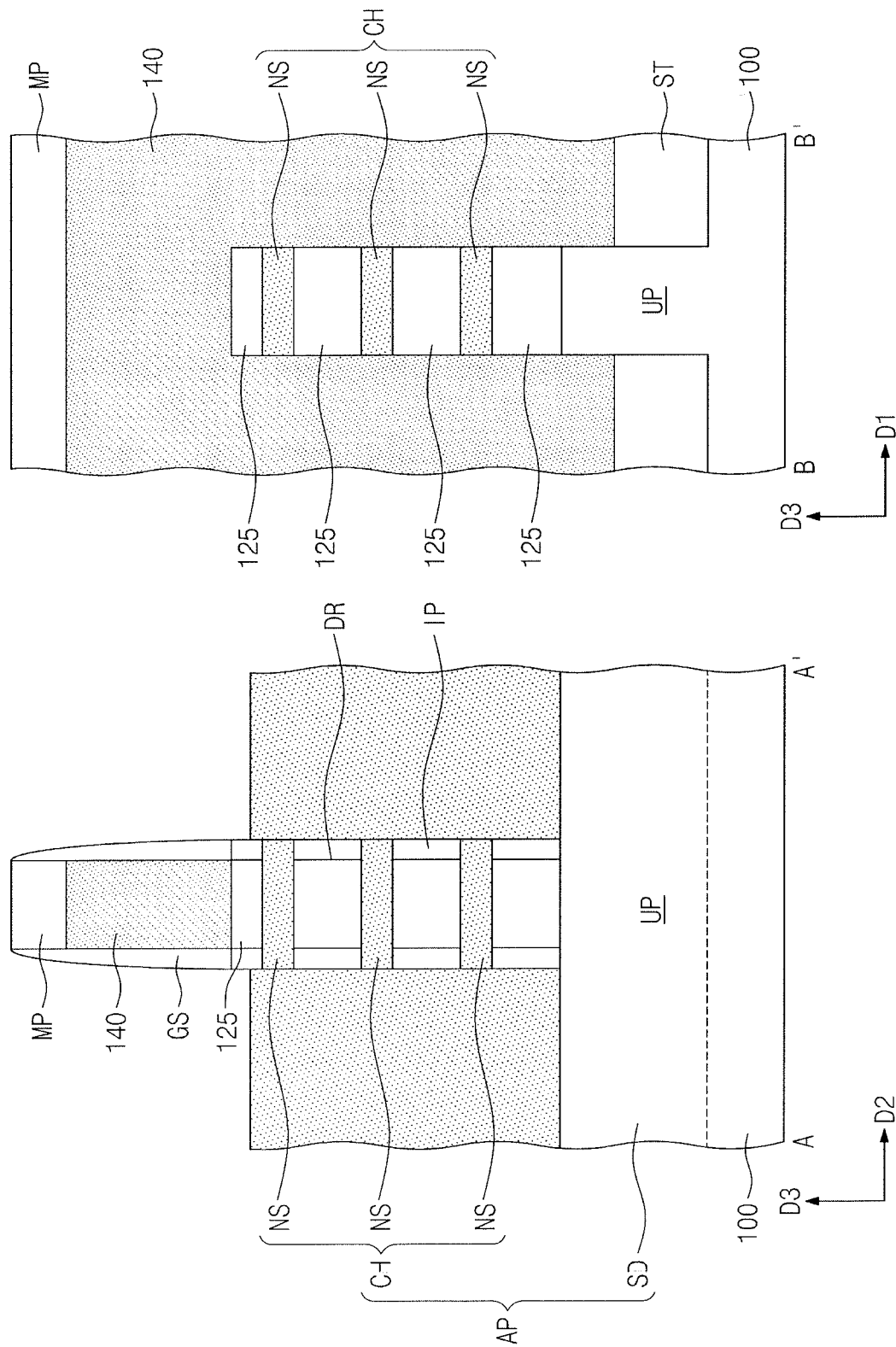
FIG. 13 illustrates a view of vertical sections taken along lines A-A' and B-B' of FIG. 12.

FIGS. 8, 10, 12, and 14 illustrate plan views of stages in a method of fabricating a semiconductor device, according to some embodiments. FIG. 9 illustrates a view of vertical sections taken along lines A-A' and B-B' of FIG. 8. FIG. 11 illustrates a view of vertical sections taken along lines A-A' and B-B' of FIG. 10, FIG. 13 illustrates a view of vertical sections taken along lines A-A' and B-B' of FIG. 12, and FIGS. 15 and 16 illustrate views of vertical sections taken along lines A-A' and B-B' of FIG. 14.

Figure 8:
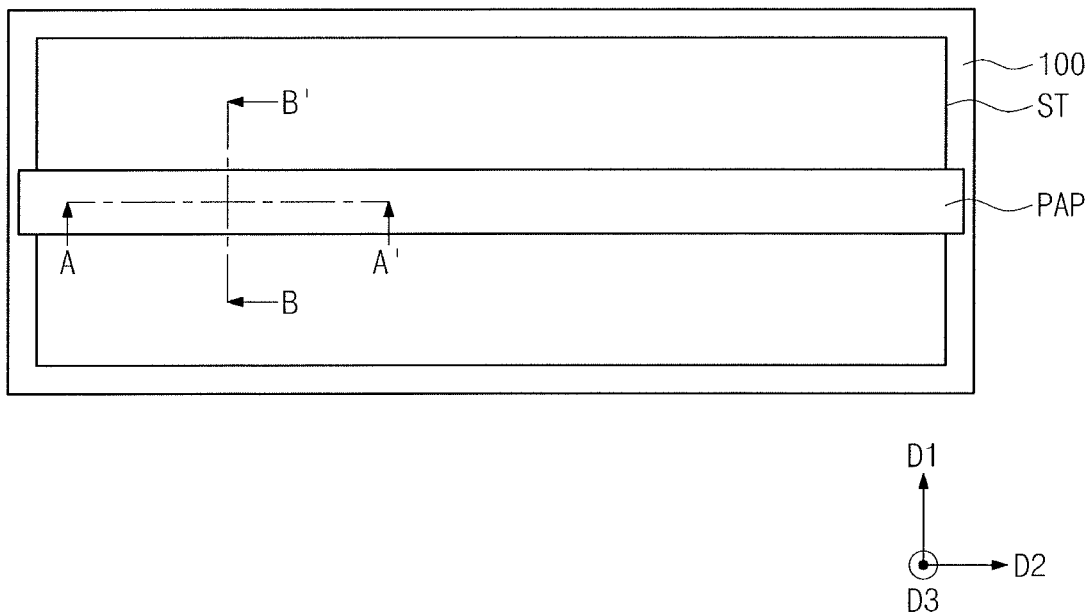
FIGS. 8, 10, 12, and 14 illustrate plan views of stages in a method of fabricating a semiconductor device, according to some embodiments.

Referring to FIGS. 8 and 9, sacrificial layers 120 and semiconductor layers 130 may be alternately and repeatedly stacked on the top surface of the substrate 100. In an implementation, three semiconductor layers 130 may be stacked on the substrate 100. In an implementation, the sacrificial layers 120 may be formed of or include a material that can be etched with an etch selectivity with respect to the semiconductor layers 130. For example, the semiconductor layers 130 may be formed of a material that is not etched during a process of etching the sacrificial layers 120. In an implementation, during the process of etching the sacrificial layers 120, a ratio in etch rate of the sacrificial layers 120 to the semiconductor layers 130 may range from 10:1 to 200:1. In an implementation, the sacrificial layers 120 may be formed of SiGe or Ge, and the semiconductor layers 130 may be formed of Si.

The sacrificial and semiconductor layers 120 and 130 may be formed by an epitaxial growth process, in which the substrate 100 is used as a seed layer. The sacrificial and semiconductor layers 120 and 130 may be formed in the same chamber without interruption. Each of the sacrificial and semiconductor layers 120 and 130 may be grown to conformally cover the top surface of the substrate 100 or to have a uniform thickness.

A patterning process may be performed on the sacrificial layers 120, the semiconductor layers 130, and the substrate 100 to form a preliminary active pattern PAP. The patterning process may be performed to etch an upper portion of the substrate 100. As a result, the upper pattern UP may be formed, and the preliminary active pattern PAP may be provided on the upper pattern UP. The preliminary active pattern PAP may be formed to have a line or bar shape and to extend in the second direction D2.

As a result of the etching process during the patterning process, trenches may be formed at both sides of the upper pattern UP. Thereafter, the device isolation layer ST may be formed to fill the trenches. The formation of the device isolation layer ST may include forming an insulating layer on the top surface of the substrate 100 and recessing the insulating layer to completely expose the preliminary active pattern PAP. For example, the device isolation layer ST may be formed to have a top surface lower than that of the upper pattern UP.

Referring to FIGS. 10 and 11, sacrificial gate patterns 140 may be formed to cross the preliminary active pattern PAP. The sacrificial gate patterns 140 may be formed to have a line or bar shape and to extend in the first direction D1. In certain embodiments, gate mask patterns MP may be formed on the sacrificial gate patterns 140, respectively. The formation of the sacrificial gate patterns 140 and the gate mask patterns MP may include sequentially forming a sacrificial gate layer and a gate mask layer on the substrate 100 and patterning the gate mask layer and the sacrificial gate layer. The sacrificial gate layer may be formed of or include poly silicon. The gate mask layer may include at least one of a silicon nitride layer or a silicon oxynitride layer.

Each pair of the gate spacers GS may be formed on two opposite side surface of a corresponding one of the sacrificial gate patterns 140. The gate spacers GS may be formed of or include. e.g., at least one of SiCN. SiCON, or SiN. The formation of the gate spacers GS may include forming a spacer layer using a deposition process, such as CVD or ALD, and then performing an anisotropic etching process on the spacer layer.

Referring to FIGS. 12 and 13, the preliminary active pattern PAP may be patterned to form the channel patterns CHI. The patterning of the preliminary active pattern PAP may be performed using the gate mask patterns MP and the gate spacers GS as an etch mask. The patterning of the preliminary active pattern PAP may be performed to expose a portion of the upper pattern UP.

For example, sacrificial patterns 125 may be formed by patterning the sacrificial layers 120 of the preliminary active pattern PAP. The semiconductor patterns NS may be formed by patterning the semiconductor layers 130 of the preliminary active pattern PAP. The semiconductor patterns NS may constitute the channel pattern CH.

After the patterning process, exposed portions of the sacrificial patterns 125 may be laterally etched to form recessed regions DR. The formation of the recessed regions DR may include an etching process, in which an etchant capable of selectively etching the sacrificial patterns 125 is used. In an implementation, in the case where the semiconductor patterns NS includes Si and the sacrificial patterns 125 includes SiGe, the formation of the recessed regions DR may include an etching process, in which an etching solution containing peracetic acid is used.

The insulating patterns IP may be formed to fill the recessed regions DR, respectively. The insulating patterns IP may be vertically spaced apart from each other with the semiconductor patterns NS interposed therebetween. For example, the formation of the insulating patterns IP may include conformally forming an insulating layer on the top surface of the substrate 100. The insulating layer may be formed to fill the recessed regions DR. Thereafter, the insulating layer may be etched to locally form the insulating patterns IP in the recessed regions DR.

The source/drain patterns SD may be formed at both sides of each of the channel patterns CH. For example, the source/drain patterns SD may be formed by a selective epitaxial process, in which the semiconductor patterns NS and the upper pattern UP are used as a seed layer. The channel patterns CHI and the source/drain patterns SD may be connected to each other to form the active pattern AP extending in the second direction D2.

In an implementation, the source/drain patterns SD may be formed of or include a material capable of exerting a compressive stress on the channel patterns CH. For example, the source/drain patterns SD may be formed of SiGe having a lattice constant larger than that of silicon. During or after the selective epitaxial process, the source/drain patterns SD may be doped with impurities to have a p type conductivity.

In an implementation, the source/drain patterns SD may be formed of the same semiconductor material (e.g., Si) as the channel pattern CH. During or after the selective epitaxial process, the source/drain patterns SD may be doped with impurities to have an n type conductivity.

Figure 14:
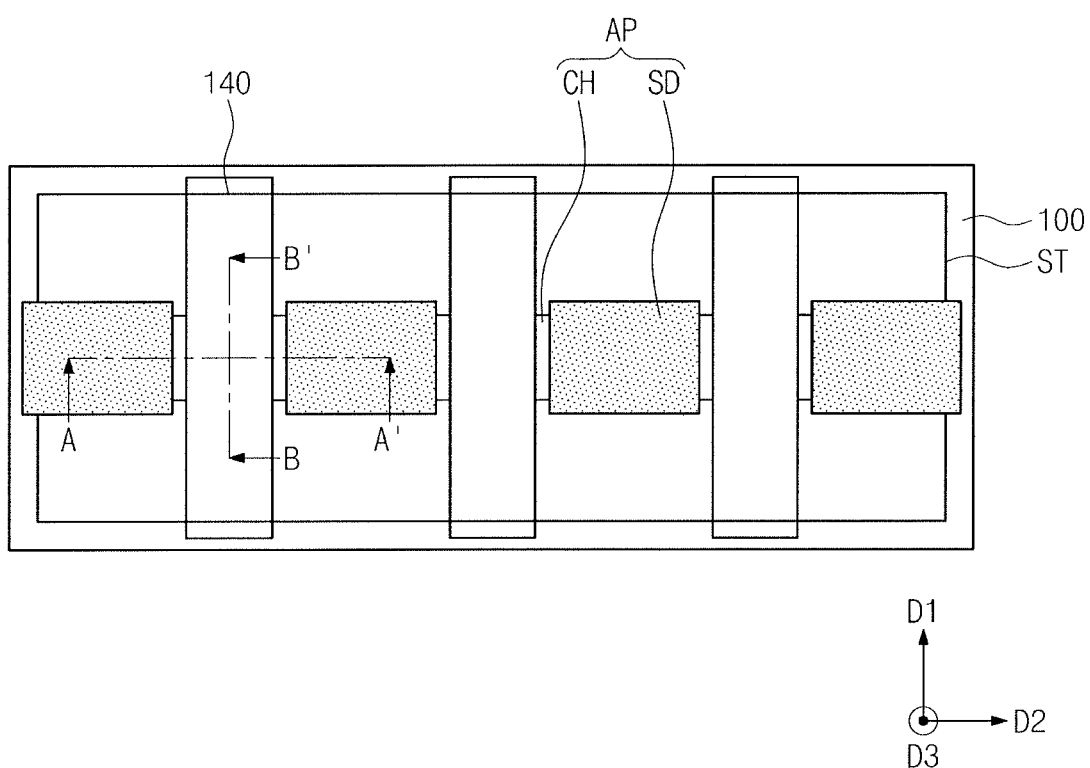
Figure 15:
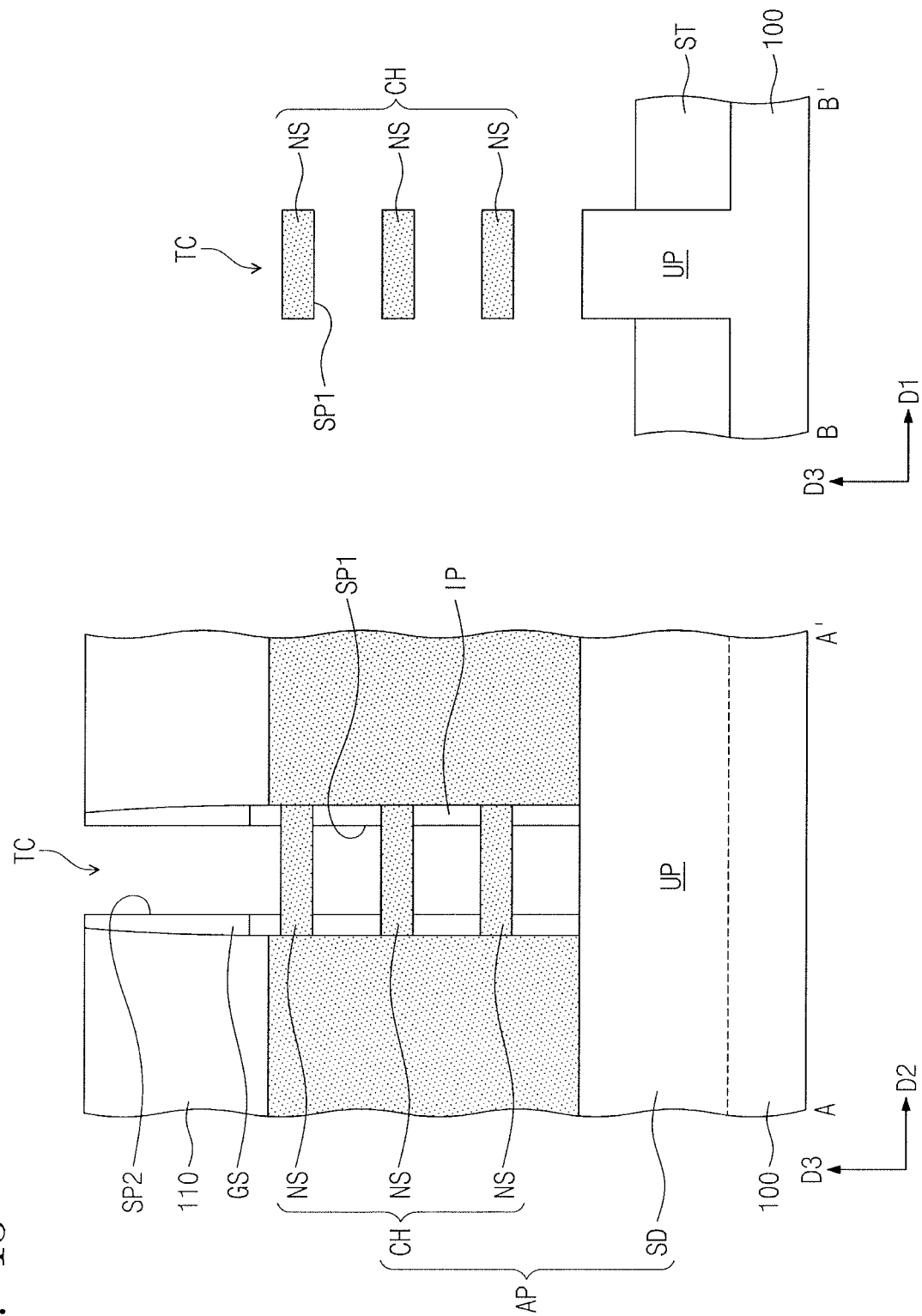
FIGS. 15 and 16 illustrate views of vertical sections taken along lines A-A' and B-B' of FIG. 14.
Figure 16:
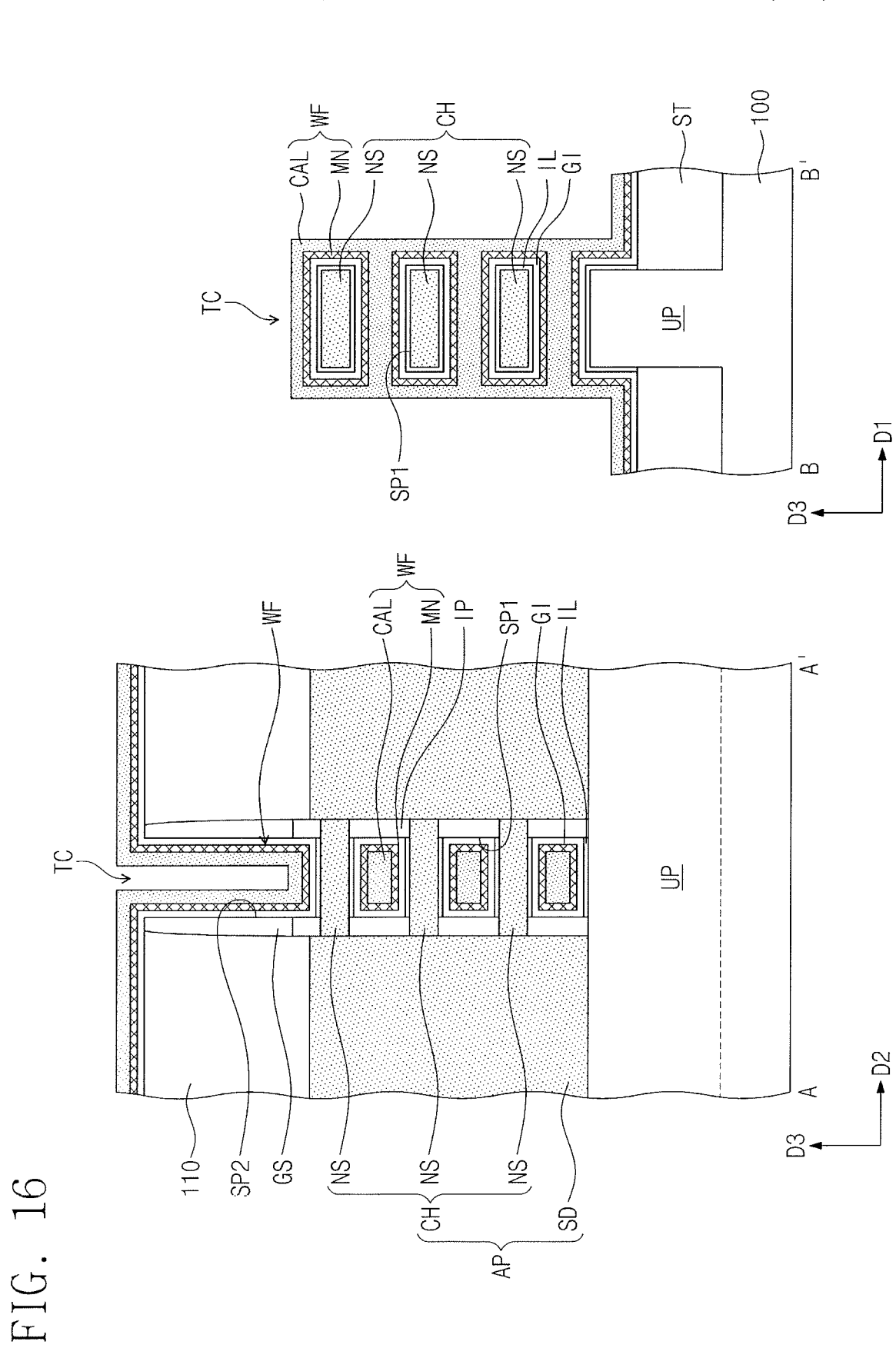

Referring to FIGS. 14 and 15, the first interlayered insulating layer 110 may be formed on the top surface of the substrate 100. Thereafter, the first interlayered insulating layer 110 may be planarized to exposed top surfaces of the sacrificial gate patterns 140. An etch-back process and/or a chemical mechanical polishing (CMP) process may be used to planarize the first interlayered insulating layer 110. In some embodiments, the gate mask patterns MP may be removed, during the planarization of the first interlayered insulating layer 110. The first interlayered insulating layer 110 may be formed of or include, for example, at least one of silicon oxide or silicon oxynitride.

The sacrificial gate patterns 140 exposed by the planarization process may be selectively removed. The removal of the sacrificial gate patterns 140 may be performed to form trenches TC on the substrate 100. In an implementation, the trenches TC may be formed to expose the channel patterns CH. The trenches TC may be formed to expose the sacrificial patterns 125.

The sacrificial patterns 125 exposed by the trenches TC may be selectively removed. In the case where the sacrificial and semiconductor patterns 125 and NS include SiGe and Si, respectively, the sacrificial patterns 125 may be removed by a selective etching process, in which an etching solution containing peracetic acid is used. The etching solution may further contain a hydrofluoric acid (HF) solution and a deionized water. In some embodiments, the source/drain patterns SD may be covered with and protected by the insulating patterns IP and the first interlayered insulating layer 110.

As a result of the removal of the sacrificial patterns 125, first and second spaces SP1 and SP2 may be formed. The first space SP1 may be an empty space that is formed between the semiconductor patterns NS, which are vertically adjacent to each other. The second space SP2 may be an empty space that is defined by a pair of the gate spacers GS and the topmost one of the semiconductor pattern NS. The first and second spaces SP1 and SP2 may be connected to the trenches TC to expose the semiconductor patterns NS.

Referring to FIGS. 14 and 16, a plasma-based oxidation process may be performed on the semiconductor patterns NS exposed by the trenches TC. In this case, the interface layers IL may be grown from the exposed surfaces of the semiconductor patterns NS. The interface layers IL may be formed to directly cover and enclose the exposed surfaces of the semiconductor patterns NS.

The formation of the interface layers IL may include a thermal oxidation process or a chemical oxidation process. In some embodiments, plasma, which is generated from at least one of oxygen, ozone, or steam, may be used for the oxidation process. The interface layers IL may be formed of or include, for example, silicon oxide.

The gate dielectric layer GI may be conformally formed on the interface layers IL. The gate dielectric layer GI may be formed to partially fill the first space SP1 of the trench TC. The gate dielectric layer GI may be formed to partially fill the second space SP2 of the trench TC. The gate dielectric layer GI may be formed to directly cover the insulating patterns IP and the interface layers IL. The gate dielectric layer GI may be formed of at least one of high-k dielectric materials whose dielectric constants are higher than that of silicon oxide.

The metal work function pattern WF may be formed in each of the trenches TC. The metal work function pattern WF may be formed to completely fill the first space SP1 of the trench TC. The metal work function pattern WF may be formed to partially fill the second space SP2 of the trench TC.

The formation of the metal work function pattern WF may include conformally forming the metal nitride layer MN in the trench TC and conformally forming the alloy layer CAL on the metal nitride layer MN. For example, the metal nitride layer MN and the alloy layer CAL may be formed by a deposition process (e.g., an ALD process). In some embodiments, the formation of the alloy layer CAL may be performed by substantially the same method as that of FIGS. 1 to 5.

In an implementation, the formation of the alloy layer CAL may include providing the first precursor containing an organoaluminum compound and providing the second precursor containing a vanadium-halogen compound. By controlling a feeding time of the first precursor, it may be possible to adjust an aluminum content of the alloy layer CAL to a desired, predetermined value. An aluminum content of the alloy layer CAL may be adjusted to control the work function and resistivity of the alloy layer CAL. This may allow a transistor to have desired electric characteristics (e.g., threshold voltage and resistance).

Referring back to FIGS. 6 and 7, an etching process may be performed to recess an upper portion of the gate dielectric layer GI and an upper portion of the metal work function pattern WF. The electrode pattern EL may be formed in each of the trenches TC. The electrode pattern EL may be formed on the recessed structure of the metal work function pattern WF. The electrode pattern EL may be formed of or include a metallic material having low resistance. The metal work function pattern WF and the electrode pattern EL may constitute the gate electrode GE.

The gate capping layer CP may be formed on the gate electrode GE. As an example, the gate capping layer CP may be formed of or include at least one of SiON, SiCN, SiCON, or SiN. In an implementation, contacts may be formed to penetrate the first interlayered insulating layer 110 and may be connected to the source/drain patterns SD.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, as the electronic industry advances, a semiconductor device may have a higher integration density and higher performance. To meet such a demand, it may be helpful to reduce a process margin (e.g., in a photolithography process). Although a variety of studies may be considered, the reduction of the process margin may lead to several issues in fabricating a semiconductor device. Accordingly, various researches are conducted.

In a fabrication method according to some embodiments, adjusting an aluminum content of the alloy layer CAL to a desired level may be facilitated. This may make it possible to form a gate-all-around type transistor with desired electric characteristics (e.g., in threshold voltage and resistance).

According to some embodiments, a method of fabricating a semiconductor device may include forming a V—Al alloy layer, whose resistivity and work function are relatively low. The V—Al alloy layer may be used as a work function controlling material in a gate-all-around type field effect transistor.

The embodiments may provide a method of fabricating a semiconductor device using an atomic layer deposition process.

The embodiments may provide a method of forming an alloy layer that includes vanadium and aluminum using an atomic layer deposition process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
forming semiconductor patterns on a substrate such that the semiconductor patterns are vertically spaced apart from each other; and
forming a metal work function pattern to fill a space between the semiconductor patterns,
wherein:
forming the metal work function pattern includes performing an atomic layer deposition (ALD) process to form an alloy layer, and
the ALD process includes:
providing a first precursor containing an organoaluminum compound on the substrate, and
providing a second precursor containing a vanadium-halogen compound on the substrate.

2. The method as claimed in claim 1, wherein:
the organoaluminum compound is represented by the following Chemical Formula 1:

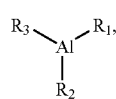

(1)

in Chemical Formula 1, $R_1$ to $R_3$ are each independently a hydrogen atom, a $C_1$-$C_{10}$ alkyl group, a $C_3$-$C_{10}$ alkenyl group, or a $C_3$-$C_{10}$ alkynyl group, provided that at least one of $R_1$ to $R_3$ is a $C_1$-$C_{10}$ alkyl group, a $C_3$-$C_{10}$ alkenyl group, or a $C_3$-$C_{10}$ alkynyl group.

3. The method as claimed in claim 1, wherein the vanadium-halogen compound includes $VCl_4$, $VCl_5$, $VF_4$, $VF_5$, $VBr_4$, or $VBr_5$.

4. The method as claimed in claim 1, further comprising forming an electrode pattern on the metal work function pattern such that the electrode pattern is formed of a low resistance metal material that has a resistance that is lower than a resistance of the metal work function pattern.

5. The method as claimed in claim 4, wherein:
the metal work function pattern is formed to completely fill the space between the semiconductor patterns, and
the electrode pattern is absent in the space between the semiconductor patterns.

6. The method as claimed in claim 1, wherein:
forming the metal work function pattern further includes forming a metal nitride layer prior to forming the alloy layer, and
the metal nitride layer has a work function that is higher than a work function of the alloy layer.

7. The method as claimed in claim 1, wherein providing the second precursor on the substrate includes reacting the second precursor with a hydrocarbon in the first precursor to form a C—V bond.

8. The method as claimed in claim 1, wherein the alloy layer has a chemical structure of $V_xAl_yC_z$, in which x ranges from 20 to 40, y ranges from 5 to 30, and z ranges from 30 to 55.

9. The method as claimed in claim 1, wherein forming the semiconductor patterns includes:
alternately and repeatedly stacking sacrificial layers and semiconductor layers on the substrate;
patterning the sacrificial layers and the semiconductor layers to form a preliminary active pattern including sacrificial patterns and semiconductor patterns; and
selectively removing the sacrificial patterns.

10. The method as claimed in claim 9, wherein selectively removing the sacrificial patterns includes:
forming sacrificial gate pattern to cross the preliminary active pattern;
forming an interlayered insulating layer on the substrate; and
selectively removing the sacrificial gate pattern to form a trench in the interlayered insulating layer such that the trench exposes the sacrificial patterns and the semiconductor patterns.

11. The method as claimed in claim 10, further comprising:
etching portions of the preliminary active pattern at both sides of the sacrificial gate pattern; and
performing a selective epitaxial process to form a pair of source/drain patterns at both sides of the sacrificial gate pattern.

12. A method of fabricating a semiconductor device, the method comprising:
forming a gate electrode on a substrate such that the gate electrode includes an alloy layer including vanadium and aluminum,
wherein forming the gate electrode including the alloy layer includes:
providing a first precursor on the substrate;
providing a second precursor containing a vanadium-halogen compound on the substrate; and
forming a metal nitride layer prior to the forming of the alloy layer such that the metal nitride layer has a work function that is higher than a work function of the alloy layer, wherein the first precursor includes a compound represented by the following Chemical Formula 1:

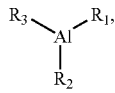 (1)

and wherein, in Chemical Formula 1, $R_1$ to $R_3$ are each independently a hydrogen atom, a $C_1$-$C_{10}$ alkyl group, a $C_3$-$C_{10}$ alkenyl group, or a $C_3$-$C_{10}$ alkynyl group, provided that at least one of $R_1$ to $R_3$ is a $C_1$-$C_{10}$ alkyl group, a $C_3$-$C_{10}$ alkenyl group, or a $C_3$-$C_{10}$ alkynyl group.

13. The method as claimed in claim 12, wherein the vanadium-halogen compound includes $VCl_4$, $VCl_5$, $VF_4$, $VF_5$, $VBr_4$, or $VBr_5$.

14. The method as claimed in claim 12, wherein forming the gate electrode further includes forming an electrode pattern on the alloy layer such that the electrode pattern is formed of a low resistance metal material having a resistance that is lower than a resistance of the alloy layer.

15. The method as claimed in claim 12, wherein the alloy layer has a chemical structure of $V_xAl_yC_z$, in which x ranges from 20 to 40, y ranges from 5 to 30, and z ranges from 30 to 55.

16. A method of fabricating a semiconductor device, the method comprising:
    forming semiconductor patterns on a substrate such that the semiconductor patterns are vertically spaced apart from each other; and
    performing an atomic layer deposition (ALD) process to form a VAlC metal work function pattern to fill a space between the semiconductor patterns,
    wherein the ALD process includes a plurality of process cycles, each process cycle including:
    providing a first precursor on the substrate, and
    providing a second precursor containing $VCl_4$ on the substrate,
    wherein the first precursor includes a compound represented by the following Chemical Formula 1:

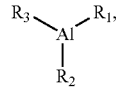 (1)

and wherein, in Chemical Formula 1, $R_1$ to $R_3$ are each independently a hydrogen atom, a $C_1$-$C_{10}$ alkyl group, a $C_3$-$C_{10}$ alkenyl group, or a $C_3$-$C_{10}$ alkynyl group, provided that at least one of $R_1$ to $R_3$ is a $C_1$-$C_{10}$ alkyl group, a $C_3$-$C_{10}$ alkenyl group, or a $C_3$-$C_{10}$ alkynyl group.

17. The method as claimed in claim 16, wherein providing the second precursor on the substrate includes reacting the second precursor with a hydrocarbon in the first precursor to form a C—V bond.

18. The method as claimed in claim 16, wherein:
    the $VCl_4$ is provided from a container,
    the $VCl_4$ in the container is in a liquid state,
    providing the second precursor includes:
        heating and evaporating the $VCl_4$ in the container; and
        feeding the evaporated $VCl_4$ into a process chamber, in which the substrate is provided, using a carrier gas.

19. The method as claimed in claim 16, wherein providing the first precursor includes controlling a feeding time of the first precursor such that a work function and resistivity of the VAlC layer is adjusted to predetermined levels.

* * * * *